United States Patent [19]

Ernst

[11] Patent Number: 4,513,247

[45] Date of Patent: Apr. 23, 1985

[54] METHOD FOR RECORDING THREE-DIMENSIONAL NUCLEAR MAGNETIC RESONANCE SPECTRA AND A DEVICE FOR CARRYING OUT THE SAME

[75] Inventor: Richard R. Ernst, Winterthur, Switzerland

[73] Assignee: Spectrospin AG, Switzerland

[21] Appl. No.: 438,182

[22] Filed: Nov. 1, 1982

[30] Foreign Application Priority Data

Nov. 4, 1981 [DE] Fed. Rep. of Germany ....... 3143626

[51] Int. Cl.³ ............................................ G01R 33/08
[52] U.S. Cl. ..................................... 324/309; 324/307
[58] Field of Search ................ 324/300, 307, 309, 311

[56] References Cited

U.S. PATENT DOCUMENTS 4,318,043  3/1982  Crooks ................................ 324/309

OTHER PUBLICATIONS

W. P. Aue et al., Two-Dimensional Spectroscopy Application to Nuclear Magnetic Resonance, Journal of Chemical Physics, vol. 64, 1976, No. 5, pp. 2229–2246.
S. Macura, Two-Dimensional Chemical Exchange and Cross-Relaxation Spectroscopy of Coupled Nuclear Spins, Journal of Magnetic Resonance, vol. 43, 1981, No. 2, pp. 259–281.

Primary Examiner—Michael J. Tokar
Attorney, Agent, or Firm—McCormick, Paulding & Huber

[57] ABSTRACT

For recording three-dimensional nuclear magnetic resonance spectra the nuclear spin-system must be excited by three 90° pulses, with variation of the pulse intervals $t_1$ and $t_m$. Instead of varying the two pulse intervals separately, which would be required for recording the two time dimensions defined by $t_1$ and $t_m$, the mixing time $t_m$ is simultaneously varied proportionally to the evolution period each time the measurement is repeated with a varied evolution period $t_1$, so that $t_m = \kappa t_1$. K is so selected that the interesting mixing time period is completely covered by the predetermined number of measurements taken with different evolution times. The variation of $t_m$ is reflected by the shape of the resonance lines and can be determined also by reverse transformation of the individual resonance lines into the time domain. A spectrometer for carrying out this method may conveniently be adapted to permit setting of the pulse interval $t_1$ and the proportionality factor K, to form therefrom automatically the second pulse interval $t_m$.

2 Claims, 6 Drawing Figures

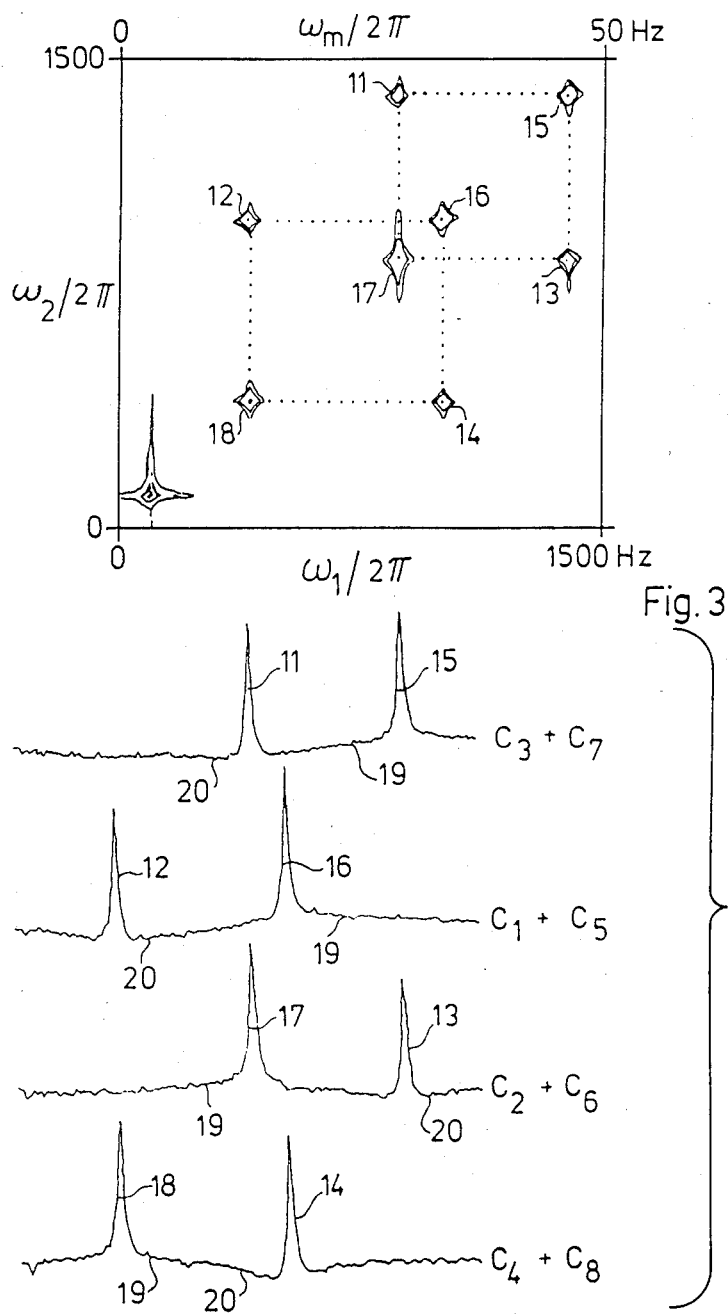

METHOD FOR RECORDING THREE-DIMENSIONAL NUCLEAR MAGNETIC RESONANCE SPECTRA AND A DEVICE FOR CARRYING OUT THE SAME

The present invention relates to a method for recording three-dimensional nuclear magnetic resonance spectra in which the nuclear spin system to be investigated is excited by three successive 90° pulses applied at intervals and the interferogram obtained after application of the third 90° pulse is subjected to Fourier analysis, in which further a plurality of such measurements is taken with different intervals between the first and the second 90° pulse (evolution period $t_1$) and the resulting different amplitude or phase parameters of the resonance lines obtained by the said Fourier analysis are stored as instantaneous values of an additional interferogram and subjected to a second Fourier analysis, and in which finally the said measurements are taken for different time intervals between the second and the third pulse (mixing time $t_m$) to detect the variations with time of the amplitude or phase parameters of the resonance lines determined by the two-fold Fourier transformation.

Nuclear magnetic resonance spectrometry makes it possible to observe exchange processes leading to variations of the resonance frequency of a nuclear spin. The Fourier analysis of the first interferogram provides information on the resonance frequency after the exchange, while the Fourier analysis of the interferogram obtained by varying the evolution period provides information on the original resonance frequency of the same excited spin moment. Accordingly, the number of measurements taken with different evolution periods $t_1$ and the variation rates of the evolution period between the individual measurements must be selected to ensure that the possible frequency variations accompanying the exchange processes are safely detected. By additionally varying the mixing time $t_m$ it is then possible to observe the transient exchange processes reflected by the build-up and decay of the individual resonance lines. In addition to the exchange processes, the Overhauser effect (NOE) may also be studied in this manner.

Apart from the fact that for mapping out very indistinct lines it may be necessary to repeat the same measurement several times and to accumulate the signals thus obtained to improve the signal-to-noise ratio, the described method requires a great number of measurements with different evolution periods $t_1$ and, what is more, the repetition of this great number of measurements for each of the different mixing time values $t_m$. Considering that the measurements carried out with a constant mixing time $t_m$ are described as two-dimensional spectroscopy, the three-dimensional spectroscopy would require a number of measurements equal to the product obtained by multiplying the number of measurements necessary for two-dimensional spectroscopy by the number of measurements for different $t_m$ delays required for recording the third dimension. So, the experimental time required for plotting a three-dimensional nuclear magnetic resonance spectrum is a multiple of the time required for plotting a two-dimensional spectrum. But considering that experimental time is an extraordinary cost factor, the plotting of three-dimensional nuclear magnetic resonance spectra was heretofore warranted only in exceptional cases.

Now, it is the object of the present invention to provide a method for mapping out three-dimensional nuclear magnetic resonance spectra which drastically reduces the required experimental time.

According to the invention, this problem is solved in that when repeating the measurement with a varied evolution period $t_1$, the mixing period $t_m$ is simultaneously varied proportionally to the evolution period ($t_m = \kappa t_1$) so as to cover the interesting mixing time area with the given number of measurements taken with different evolution periods, and that the transient amplitude variation of the resonance lines is determined either from the shape of the obtained resonance lines or by reverse transformation of the individual resonance lines into the time domain along the frequency axis ($\omega_1$, $\omega_m$) corresponding to the evolution and mixing times $t_1$, $t_m$.

The method of the invention reduces the experimental time necessary for three-dimensional experiments to the experimental time necessary for two-dimensional experiments, i.e. to a fraction of the time required heretofore. So, three-dimensional experiments are no longer hindered by time considerations. The proportionality factor $\kappa$ is selected to ensure that simultaneously with the required variation of $t_1$ the interesting mixing time domain is covered by equal increments of typically 0.1 to 20 seconds. The transient variation of the amplitude of the resonance lines is reflected after Fourier transformation in a typical deformation of the resonance line which permits the necessary conclusions with respect to the transient variation. The latter can be detected with great ease by reverse transformation of the individual resonance lines into the time domain. This makes it possible to analyse each individual line by correspondingly limitation of the transformation frequency range.

The method of the invention is suited for all nuclear magnetic resonance spectrometers comprising a generator for generating three successive HF-pulses at selective intervals.

But the invention has also for its object to provide a nuclear magnetic resonance spectrometer of this type which is particularly suited for carrying out the method of the invention and which is characterized in that it comprises means for presetting mutually proportional intervals $t_1$ and $t_m = \kappa t_1$ by selecting a first interval $t_1$ and the proportionality factor $\kappa$.

Further details and advantages of the invention will be described hereafter with reference to the drawings in which:

FIG. 3 shows the two-dimensional spectrum of cis-decalin, recorded at 240 K;

FIG. 4 shows four cross-sections through the spectrum of FIG. 3 the lines of which are characteristic of the method of the invention.

Figure 1:
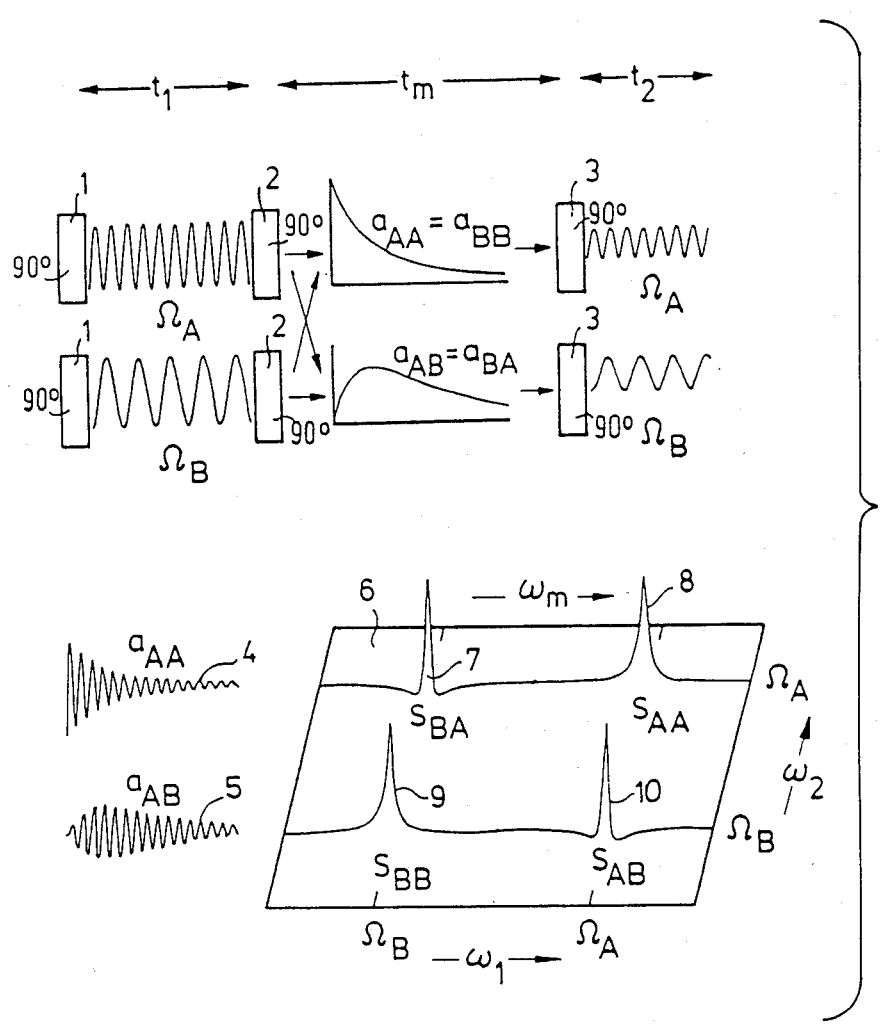
FIG. 1 shows the time diagram of the signals and mixing functions involved in the method of the invention, for a system with two exchanging nuclei, and the associated two-dimensional spectrum.

As shown in FIG. 1, an experiment according to the method of the invention starts with two 90° pulses 1 and 2, separated by an evolution period $t_1$, which impart a modulation to the longitudinal magnetization of the various sites of the substance to be investigated or the spin system to be studied. If a chemical exchange takes place in the substance under investigation or transient Overhauser effect can be observed, these magnetizations migrate from site to site in the subsequent period $t_m$. Finally, a detection period $t_2$ required to identify the product is tripped by a third 90° pulse. To map out the dynamic processes the mixing time $t_m$ is varied in addition to the variation of the evolution and detection periods. According to the invention, this variation of the mixing time $t_m$ is directly proportional to the variation of the evolution time $t_1$ so that $$t_m = \kappa t_1 \tag{1}$$

Because of the concerted "stretching" of the pulse sequence, the method of the invention seems to be well described by the term "accordion" spectroscopy.

The salient feature of the method of the invention is the accomodation of two-dimensional information along a single time or frequency axis. FIG. 1 shows the composite time-domain signals 4 and 5 which consist each of an oscillation corresponding to the frequency exited in the evolution period $t_1$, and envelopes determined by the exchange process in the mixing time $t_m$. These envelopes are representative of mixing functions $a_{ij}(t_m)$ for diagonal lines and $a_{ij}(t_m)$ for cross-peaks in the two-dimensional spectrum. By subjecting these signals $s(t_1, t_m = \kappa t_1, t_2)$ to a two-dimensional Fourier transformation with respect to $t_1$ and $t_2$, one obtains a two-dimensional frequency domain $S(\omega_1, \omega_m = (1/\kappa)\omega_1, \omega_2)$ where the axes $\omega_1$ and $\omega_m$ run in parallel.

From the representation of the two-dimensional frequency domain 6 in FIG. 1 it appears that just as in the known two-dimensional spectroscopy, the positions of lines 7 to 10 characterize the origin ($\omega_1$) and destination ($\omega_2$) of the exchanging magnetization. The third-dimension ($\omega_m$) is reflected in the lineshapes along the $\omega_1, \omega_m$ axis. This lineshape corresponds to Fourier transforms with respect to the mixing period $t_m$ of the mixing functions $a_{ii}(t_m)$ and $a_{ij}(t_m)$. They contain all information relevant to the dynamic process. It will be shown that these mixing functions can be retrieved from the accordion spectrum by a third, inverse Fourier transformation for any pair of sites i, j.

Figure 2:
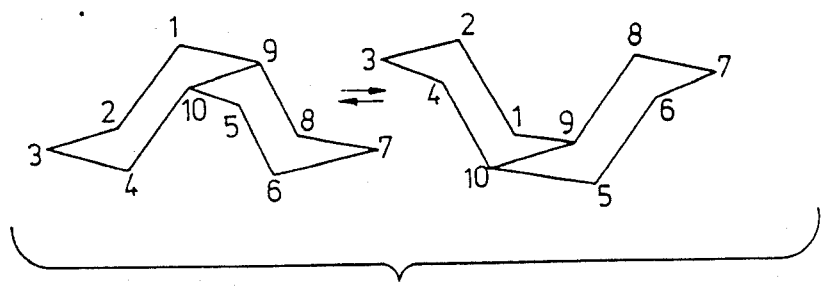
FIG. 2 is a diagrammatic representation of the different configurations of cis-decalin leading to exchange processes.

To illustrate these features in greater detail, they will be described hereafter with reference to a practical example, i.e. with reference to the ring-inversion of cis-decalin ($C_{10}H_{18}$), as shown in FIG. 2. FIG. 3 shows the contour plot of a proton-decoupled carbon-13 accordion spectrum of cis-decalin at 240 K. It will be noted that each of the $\omega_1$ and $\omega_2$ domains extends over 1500 Hz, while the $\omega_m$ domain covers only 50 Hz. Accordingly, the scaling factor had been chosen to be $\kappa = 30$. The ring inversion of the cis-decalin causes a two-fold, pair-wise exchange of the carbon atoms $(C_1 + C_5) \rightleftarrows (C_4 + C_8)$ and $(C_2 + C_6) \rightleftarrows (C_3 + C_7)$. This two-fold, pair-wise exchange leads to the formation of four cross-peaks 11 to 14, as can be seen in FIG. 3.

FIG. 4 shows phase-sensitive cross-sections through the spectrum shown in FIG. 3, taken in parallel to the $\omega_1, \omega_m$ axis. The sequence of the cross-sections shown in FIG. 4 is from top to bottom. It can be noted that the diagonal lines 15 to 18 consist of narrow peaks placed on top of a broader base 19, while the cross-peaks 11 to 14 appear in shallow depressions 20 of the base lines which are in fact broad negative signals.

For the simple two-site case with an exchange rate constant k, equal populations and equal spin-lattice relaxation rates $R_1$, it can be shown that the lineshape consists of the superposition of two Lorentzian functions with equal integrated intensities but different widths. For the diagonal peaks one obtains $$S_{ii}(\omega_m) = \frac{1}{2}\left[\frac{R_1}{R_1^2 + \Delta\omega_m^2} + \frac{2k + R_1}{(2k - R_1)^2 + \Delta\omega_m^2}\right], \tag{2}$$

and for cross-peaks:

$$S_{ij}(\omega_m) = \frac{1}{2}\left[\frac{R_1}{R_1^2 + \Delta\omega_m^2} - \frac{2k - R_1}{(2k - R_1)^2 + \Delta\omega_m^2}\right]. \tag{3}$$

It goes without saying that such lineshapes can be analyzed by least squares fitting procedures. In some cases, however, the time evolution of diagonal and cross-peaks is more revealing when visualized in the mixing time domain $t_m$. The time evolution can be retrieved by a reverse Fourier transformation of $\omega_m$. In order to focus on a selected cross-peak $S_{ij}(\omega_m)$, one must discard all other signals in the cross-section through the two-dimensional diagram by selecting a suffienly narrow frequency band in the $\omega_1$ domain. In practice, a cross-section taken along the $\omega_2, \omega_m$ direction is multiplied by a window function $W(\Omega_i, \Delta\omega)$ which is equal to unity in the interval between $\omega_1 = \Omega_i - \Delta\Omega/2$ and $\omega_1 = \Omega_i + \Delta\Omega/2$ and equal to zero elsewhere. The inverse Fourier transformation is calculated according to $$S_{ij}(t_m) = \frac{1}{2\pi} \int_{-\infty}^{+\infty} S(\omega_m) W(\Omega_i, \Delta\Omega) e^{i\omega_m t_m} d\omega_m \tag{4}$$

For diagonal peaks, one obtains $$S_{ii}(t_m) = \frac{1}{2}[1 + e^{-2kt_m}]e^{-R_1 t_m} e^{i\Omega_i t_1} * F^{-1}\{W\} \tag{5}$$

and for cross-peaks $$S_{ij}(t_m) = \frac{1}{2}[1 - e^{-2kt_m}]e^{-R_1 t_m} e^{i\Omega_i t_1} * F^{-1}\{W\} \tag{6}$$

The first two factors represent the mixing functions for the two-site system which describe the build-up and decay of the diagonal and cross-peaks. They contain the relevant information, namely the exchange rate constant k and the relaxation rate $R_1$.

The last two factors in Eqs. (5) and (6) do not carry valuable information. The selection of a narrow window function in the $\omega_1$ domain leads to a convolution of the $t_m$ time domain signal with a function of the type $\sin t_m/t_m$. Provided the window is significantly wider than the broadest of the two Lorentzians in $S_{ij}(\omega_m)$, this convolution will not affect the time-domain envelope. The complex oscillating terms of Eqs. (5) and (6) arise from the offset $\Omega_i$ of the peaks in the $\omega_1$ domain. This oscillating part may be removed by forming the absolute value in the $t_m$ time domain after the inverse Fourier transformation:

$$\langle S_{ij}(t_m) \rangle = [Re\{S_{ij}(t_m)\}^2 + Im\{S_{ij}(t_m)\}^2]^{\frac{1}{2}} = \frac{1}{2}(1 \pm e^{-2kt_m})e^{-R_1 t_m} \tag{7}$$

Such a treatment presupposes that the mixing functions are real and positive semidefinite. This requirement is generally fulfilled, provided the longitudinal magnetization of all spins is in thermal equilibrium prior to the first pulse of the accordion experiment. If the spin-temperature is non-uniform, the mixing functions may change sign and would be distorted by taking the absolute value according to Eq. (7).

Figure 5:
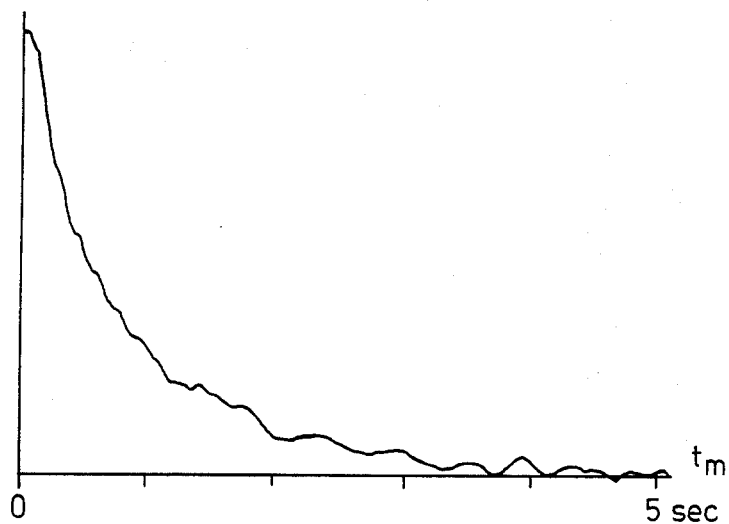
FIGS. 5 and 6 show the mixing functions obtained by inverse Fourier transformation of the diagonal and/or cross-peaks recorded in the lower cross-section of FIG. 4.
Figure 6:
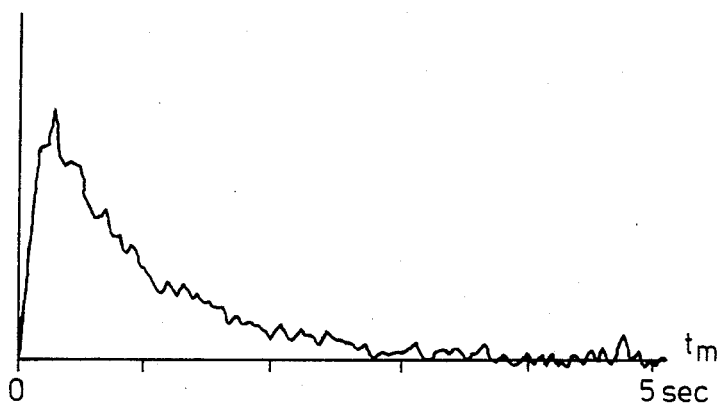

FIGS. 5 and 6 show experimentally obtained inverse Fourier transformations of the diagonal and cross-peaks of cis-decalin, appearing in the lowest trace of FIG. 4. The same mixing functions could have been obtained, albeit in a much more laborious manner, by recording a plurality of two-dimensional spectrograms for various $t_m$ values. The mixing functions show typical shapes, namely a monotonic, biexponential decay for a diagonal peak and a build-up and subsequent decay for a cross-peak. For systems with several exchanging sites, the mixing functions consist of superpositions of a number of exponential functions identical to the number of exchanging sites present, and a least squares analysis is normally required to separate the different speed parameters.

Occasionally difficulties may be encountered in selecting the proper frequency band for the inverse Fourier transformation because the broad pedestals of the cross- and diagonal peaks tend to overlap in the $\omega_1$, $\omega_2$ domain, as can be seen in FIG. 4. This problem can in principle be alleviated by selecting a smaller proportionality factor K. However, by decreasing the linewidth contributions caused by the exchange process, the linewidth due to the $T_2^*$ decay in the evolution period may become dominant, thus lowering the accuracy of measurement of the rate parameters. It is evident that the ordinary one-dimensional spectrum must be sufficiently well resolved to allow for additional line broadening without excessive overlap.

In some situations, the time domain signal is more revealing than the frequency domain lineshape, especially when a qualitative analysis is sufficient. In particular, it is possible by mere inspection to identify higher order processes. For example, in the linear system of the type A⇌B⇌C the transfer from A to C is a second order process. In the $t_m$ domain, a transfer function $a_{AC}(t_m)$ has a vanishing derivative at $t_m=0$, in contrast to all first order processes.

It results from the above, that the accordion method of the invention provides a simplified approach to three-dimensional spectroscopy by representing two dimensions along a single frequency axis. The method is applicable whenever one of the two dimensions exhibits discrete, narrow signals while the second dimension is represented by relatively smooth lineshape functions, a situation which is indeed given in two-dimensional exchange spectroscopy. The method of the invention can be applied both to the study of chemical exchange processes and to the investigation of transient Overhauser effects in biological macromolecules. Further applications are to be seen in the investigation of spin-lattice relaxation in multilevel systems and spin diffusion or cross-polarization in solids.

For recording the spectra shown in the drawing, a nuclear magnetic resonance spectrometer make Bruker-Analytik GmbH, type CXP 300 has been employed. This spectrometer permits the generation of 90° pulse sequences with independently variable and programmable pulse intervals. For carrying out the method of the invention, a spectrometer of this type may be especially adapted so that instead of the time pairs $t_1$, $t_m$ only the time $t_1$ and the proportionality factor K must be set or, when measuring is carried out in a programmed manner, entered whereupon the spectrometer will itself form the second pulse interval $t_m = \kappa t_1$. It results that whenever the terms "set" or "setting" are used herein, entering of a corresponding command into the control means of a spectrometer of this type is also included.

I claim:

1. A method for recording three-dimensional nuclear magnetic resonance spectra in which the nuclear spin system to be investigated is excited by three successive 90° pulses applied at intervals and an interferogram obtained after application of the third 90° pulse is subjected to Fourier analysis, in which further a plurality of such measurements is taken with different intervals between the first and the second 90° pulse known as the the evolution period $t_1$ and selected parameters of the resonance lines obtained by the said Fourier analysis are stored as instantaneous values of an additional interferogram and subjected to a second Fourier analysis, and in which finally the said measurements are taken for different time intervals between the second and the third pulse known as the mixing time $t_m$ to detect the variations with time of the selected parameters of the resonance lines determined by the two-fold Fourier transformation, characterized in that each time the measurement is repeated with a varied evolution period $t_1$, the mixing time $t_m$ is simultaneously varied proportionally to the evolution period so as to cover a region of the mixing time of interest with the given number of measurements taken with different evolution periods, and that the transient amplitude variation of the resonance lines is determined either from the shape of the obtained resonance lines or by reverse transformation of the individual resonance lines into the time domain along the frequency axis corresponding to the evolution period and mixing time, $t_1$, $t_m$ respectively.

2. A nuclear magnetic resonance spectrometer for carrying out the method of claim 1, comprising a generator for generating three successive HF pulses at selective intervals, characterized in that the generator includes means for presetting the mutually proportional evolution period $t_1$ and the mixing time tm, whereby $t_m = \kappa t_1$, by selecting the evolution period $t_1$ and the proportionality factor $\kappa$.

* * * * *